(12) United States Patent
Matsumoto et al.

(10) Patent No.: US 9,585,253 B2
(45) Date of Patent: Feb. 28, 2017

(54) ELECTRONIC DEVICE

(71) Applicant: DENSO CORPORATION, Kariya, Aichi-pref. (JP)

(72) Inventors: Eiichi Matsumoto, Kariya (JP); Takumi Shiomi, Kariya (JP); Naoki Ueda, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/948,487

(22) Filed: Nov. 23, 2015

(65) Prior Publication Data
US 2016/0262266 A1 Sep. 8, 2016

(30) Foreign Application Priority Data

Mar. 5, 2015 (JP) ................... 2015-043937

(51) Int. Cl.
*H01R 12/00* (2006.01)
*H05K 1/11* (2006.01)
*H01R 12/71* (2011.01)
*H05K 5/00* (2006.01)
*H05K 5/02* (2006.01)
*H01R 12/58* (2011.01)

(52) U.S. Cl.
CPC ........... *H05K 1/116* (2013.01); *H01R 12/585* (2013.01); *H01R 12/71* (2013.01); *H05K 5/0026* (2013.01); *H05K 5/02* (2013.01)

(58) Field of Classification Search
CPC ............ H01R 23/7073; H01R 23/6873; H01R 12/58; H01R 12/585; H01R 9/091; H05K 3/308

USPC ........................................ 439/79, 80, 82, 84
See application file for complete search history.

(56) References Cited

U.S. PATENT DOCUMENTS

| | | | |
|---|---|---|---|
| 6,210,180 B1 * | 4/2001 | Lee ................... | H01R 13/4361 439/79 |
| 6,719,573 B2 * | 4/2004 | Koehler .............. | H01R 12/585 29/837 |
| 6,866,523 B2 * | 3/2005 | Yamashita ............ | H01R 12/58 439/79 |
| 7,249,957 B2 * | 7/2007 | Watanabe .......... | H01R 12/7064 439/79 |
| 2004/0145880 A1 * | 7/2004 | Watanabe .............. | H05K 3/308 361/803 |
| 2005/0003686 A1 | 1/2005 | Sakata et al. | |

FOREIGN PATENT DOCUMENTS

| | | |
|---|---|---|
| EP | 1034983 A2 | 9/2000 |
| JP | 3673422 B2 | 7/2005 |
| JP | 2008-60184 A | 3/2008 |

* cited by examiner

*Primary Examiner* — Hien Vu

(57) ABSTRACT

A circuit board has a through hole extending from a front surface to a rear surface. A press-fit terminal is press-fitted from the front surface into the through hole and is connected to a land, which is formed on a wall surface of the through hole. A support member supports the rear surface of the circuit board when the press-fit terminal is press-fitted into the through hole. A housing has a bottom portion and an opening, which is on the opposite side of the bottom portion. The circuit board is affixed to the housing to cover both the opening and the support member. The support member is held and interposed between the rear surface and an inner surface of the bottom portion.

17 Claims, 7 Drawing Sheets

ELECTRONIC DEVICE

CROSS REFERENCE TO RELATED APPLICATION

This application is based on reference Japanese Patent Application No. 2015-043937 filed on Mar. 5, 2015, the disclosure of which is incorporated herein by reference.

TECHNICAL FIELD

The present disclosure relates to an electronic device.

BACKGROUND

Patent Document 1 discloses a conventional electronic device including a printed circuit board (circuit board), a terminal (press-fit terminal), and a circuit board jig (support member). The printed circuit board has a through hole into which a press-fit terminal is press-fitted. The terminal is press-fitted from the front side of the printed circuit board into the through hole.

When the terminal is press-fitted into the through hole, the printed circuit board tends to be deformed. The circuit board jig supports the printed circuit board from the rear side, which is opposite to the front side, when the terminal is press-fitted into the through hole. The circuit board jig restricts the printed circuit board from being deformed.

(Patent Document 1)
Publication of Unexamined Japanese Patent Application No. 2004-342363

A configuration is assumable in which an electronic device includes a housing in order to, for example, protect the printed circuit board. The housing is in a box shape having one opening side, which is opposite to a bottom side. The opening side is covered with the printed circuit board. The printed circuit board is affixed to the housing.

Specifically, the electronic device is manufactured by implementing the following assembling method. First, the printed circuit board is placed onto a rear surface of the circuit board jig. Subsequently, an external force is applied to urge the circuit board jig onto the printed circuit board. In the present state, the terminal is press-fitted from the front side into the through hole. Subsequently, the circuit board jig is removed from the printed circuit board. After the circuit board jig is removed, the printed circuit board is affixed to the housing. It is noted that, this assembling method requires to apply an external force to affix the circuit board jig onto the printed circuit board, when the terminal is press-fitted. Furthermore, this assembling method requires the process to remove the printed circuit board from the circuit board jig. Therefore, this assembling method requires an additional process to increase an assembling process.

It is further noted that another assumable assembling method for an electronic device, in which a circuit board jig need not be removed, may be employable. In this assembling method, the circuit board jig is affixed to the printed circuit board and/or the housing by using an adhesive material, a screw, and/or the like, such that the circuit board jig is not movable in the housing. Subsequently, the printed circuit board is affixed to the housing, and the terminal is press-fitted into the through hole. It is noted that, this assembling method requires a process to affix the circuit board jig to the printed circuit board and/or the housing by using an adhesive material, a screw, and/or the like. Therefore, this assembling method requires an additional process to increase an assembling process.

SUMMARY

It is an object of the present disclosure to produce an electronic device configured to restrict a circuit board from deforming and to restrict an assembling process from increasing.

According to an aspect of the present disclosure, an electronic device comprises a circuit board having at least one through hole and a land. The at least one through hole extends from a front surface to a rear surface, which is on an opposite side of the front surface. The land is formed on a wall surface of the at least one through hole. The electronic device further comprises at least one press-fit terminal press-fitted from the front surface into the at least one through hole and connected to the land by application of a counter force caused by elastic deformation. The electronic device further comprises at least one support member located on a side of the rear surface of the circuit board. The at least one support member supports the circuit board when the at least one press-fit terminal is press-fitted into the at least one through hole. The electronic device further comprises a housing in a box shape and having a bottom portion and an opening. The opening is located on an opposite side of the bottom portion. The opening is covered with the circuit board such that that the circuit board covers the at least one support member. The circuit board is affixed to the housing such that the rear surface is located on a side of the housing. The at least one support member is held and interposed between the rear surface and an inner surface of the bottom portion in a thickness direction of the circuit board. The inner surface is located on a side of the circuit board.

According to another aspect of the present disclosure, an electronic device comprises a circuit board having a through hole and a land. The through hole extends from a front surface to a rear surface, which is on an opposite side of the front surface. The land is formed on a wall surface of the through hole. The electronic device further comprises a press-fit terminal press-fitted from the front surface into the through hole and connected to the land by application of a counter force caused by elastic deformation. The electronic device further comprises a housing in a box shape and having a bottom portion and an opening. The opening is located on an opposite side of the bottom portion. The opening is covered with the circuit board. The circuit board is affixed to the housing such that the rear surface is located on a side of the housing. The housing has a projection projected from an inner surface of the bottom portion toward the rear surface, the inner surface being on a side of the circuit board. The projection is in contact with the rear surface and supports the circuit board when the press-fit terminal is press-fitted into the through hole.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Figure 1:
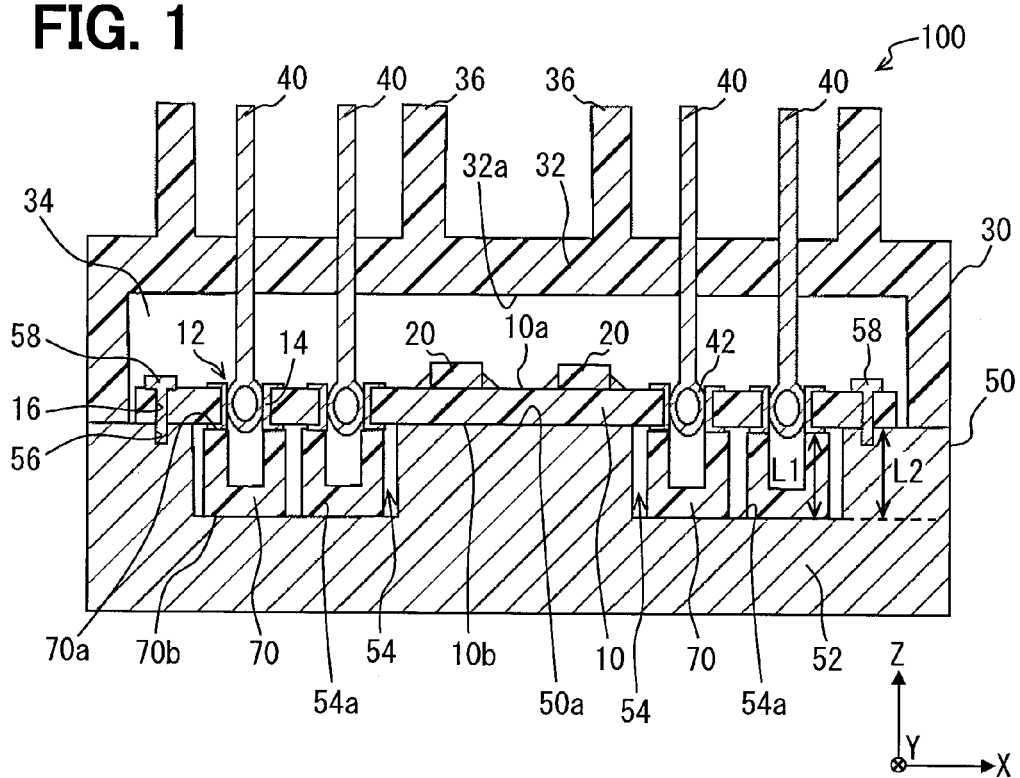
FIG. 1 is a sectional view showing an electronic device according to a first embodiment.

As follows, embodiments of the present disclosure will be described with reference to drawings. In the following embodiments, the same elements or related elements may be denoted by the same reference numeral. A thickness direction of a circuit board is represented by a Z direction, a specific direction perpendicular to the Z direction is represented by an X direction, and a direction perpendicular to both the direction of Z and the X direction is represented by a Y direction. A shape in parallel with an X-Y plane is represented by a planar shape.

(First Embodiment)

As follows, an outline of an electronic device 100 and a detailed configuration of a support member 70 will be described with reference to FIGS. 1 to 4.

As shown in FIG. 1, the electronic device 100 includes a circuit board 10, electronic components 20, a case 30, press-fit terminals 40, a housing 50, and support members 70. In the present embodiment, the electronic device 100 is, for example, an electronic control unit (ECU) of a vehicle. The electronic device 100 is connected to a battery and another ECU, which is different from the electronic device 100.

The circuit board 10 is, for example, a printed circuit board. The circuit board 10 has through holes 12 and first lands 14. The through holes 12 are formed in the circuit board 10 to extend from a front surface 10a to a rear surface 10b. The rear surface 10b is opposite to the front surface 10a. In the present embodiment, each of the front surface 10a and the rear surface 10b is a plane in parallel with the X-Y plane.

Figure 2:
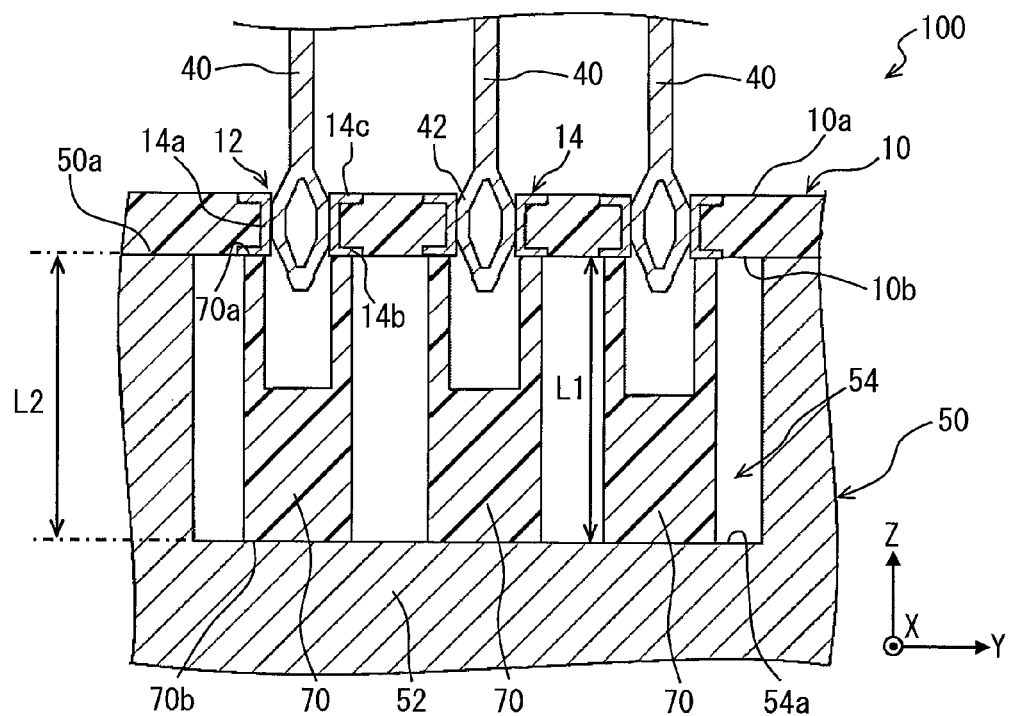
FIG. 2 is an enlarged sectional view showing a detailed configuration of support members of the electronic device.

The first lands 14 are electrodes of the circuit board 10. The first lands 14 are formed correspondingly to the through holes 12. The first land 14 is formed of a metallic material. As shown in FIG. 2, the first land 14 includes a wall surface portion 14a, a rear surface portion 14b, and a front surface portion 14c. The wall surface portion 14a is formed on a wall surface of the through hole 12. The rear surface portion 14b is formed on the rear surface 10b. The front surface portion 14c is formed on the front surface 10a. The wall surface portion 14a, the rear surface portion 14b, and the front surface portion 14c are connected to each other. The first land 14 may be equivalent to a land.

The circuit board 10 includes the multiple through holes 12. The circuit board 10 includes the first land 14 correspondingly to the through holes 12. In the present embodiment, the circuit board 10 has eight through holes 12 and includes eight first lands 14.

The circuit board 10 has through holes 16 each being formed to extend from the front surface 10a to the rear surface 10b. The through holes 16 enable screw connection of the circuit board 10 onto the housing 50. In a projection view along the Z direction, the through holes 16 are formed at positions different from the positions of the through holes 12 and the first lands 14. The circuit board 10 has the multiple through holes 16. The circuit board 10 has wirings (not shown) on the front surface 10a and the rear surface 10b. The wirings are covered with a resist material such as a light-sensitive film (not shown).

The circuit board 10 further includes second lands (not shown). The second lands are electrodes of the circuit board 10 used when electronic components 20 are mounted. The second lands are formed selectively (only) on the front surface 10a.

The electronic components 20 and the circuit board 10 from an electronic circuit. In the present embodiment, the electronic components 20 are mounted selectively (only) on the front surface 10a. The electronic components 20 are, for example, surface-mount-type electronic components. The electronic components 20 may be, for example, microcomputers.

The case 30 has a bottom portion 32. The case 30 is in a box-shape having an opening on the opposite of the bottom portion 32. The opening of the case 30 is covered with a front surface 50a of the housing 50. The case 30 is located so that the case 30 surrounds the circuit board 10 and the electronic components 20. The bottom portion 32 of the case 30 has an inner surface 32a on the side of the circuit board 10. The inner surface 32a is opposed to the front surface 10a. The case 30 is formed of a resin material.

The case 30 and the housing 50 form an accommodation space 34. The accommodation space 34 accommodates the circuit board 10, the electronic components 20, the press-fit terminals 40, and a part of the support member 70.

The case 30 has extended portions 36. The extended portions 36 are extended from the bottom portion 32 toward an opposite side of the circuit board 10 in the Z direction. Each of the extended portions 36 is in a cylindrical shape. The extended portions 36 and the bottom portion 32 form a connector housing. The connector housing is fitted with connectors of external devices. In the present configuration, the case 30 functions as an accommodation member forming the accommodation space 34. In addition, the case 30 also functions as the connector housing. In the present embodiment, the external devices may be a battery and an ECU. The case 30 includes two extended portions 36 correspondingly to the battery and the ECU.

The press-fit terminals 40 are integrally formed with the bottom portion 32 by insert molding or the like. That is, the press-fit terminals 40 are held by the bottom portion 32. The connector housing and the press-fit terminals 40 form the connector. The connector electrically relays the circuit board 10 with the external device.

The press-fit terminals 40 are extended in the Z direction. The press-fit terminals 40 have one ends located in a hollow space of the extended portion 36. The press-fit terminals 40 have the other ends forming resilient portions 42. The resilient portions 42 are press-fitted into the through holes 12, respectively. Connectors of the external devices are fitted to with connector housing, thereby to electrically connect the press-fit terminals 40 with the external devices.

The resilient portions 42 are mounted on the side of the front surface 10a of the circuit board 10 and are press-fitted to the through holes 12. The resilient portions 42 are press-fitted and are resiliently deformed to apply counter forces on the wall surface portions 14a, respectively. That is, the resilient portions 42 are in pressure contact with the wall surface portions 14a. The present configuration connects the press-fit terminals 40 electrically with the circuit board 10.

In the present embodiment, the electronic device 100 includes the multiple press-fit terminals 40 corresponding to the through holes 12, respectively. In other words, the circuit board 10 includes the multiple through holes 12 and the multiple first lands 14 correspondingly to the multiple press-fit terminals 40. The electronic device 100 includes the eight press-fit terminals 40. Two of the eight press-fit terminals 40 are for the connector of the battery. Remaining six of the eight press-fit terminals 40 are for the connector of the ECU.

The housing 50 has a bottom portion 52. The housing 50 is in a box-shape having an opening on the opposite of the bottom portion 52. The opening of the housing 50 is covered with the circuit board 10. The circuit board 10 is affixed to the housing 50, such that the rear surface 10b of the circuit board 10 is on the side of the housing 50. The front surface 50a of the housing 50 is in contact with the rear surface 10b of the circuit board 10 and closes the opening of the case 30. The housing 50 has recessed portions 54. The recessed portions 54 are dented from the front surface 50a by a predetermined depth. The recessed portions 54 have openings covered with the rear surface 10b of the circuit board 10.

The housing 50 surrounds the support members 70. Specifically, the support members 70 are located in the recessed portions 54 of the housing 50. In other words, each of the recessed portions 54 has an inner surface 54a opposed to the rear surface 10b, and the support members 70 are located between the inner surface 54a and the rear surface 10b. The inner surface 54a is a surface of the bottom portion 52 on the side of the rear surface 10b. The front surface 50a and the inner surface 54a are flat planes in parallel with the X-Y plane. The housing 50 is formed of a metallic material. The bottom portion 52 may be equivalent to a bottom portion.

Figure 3:
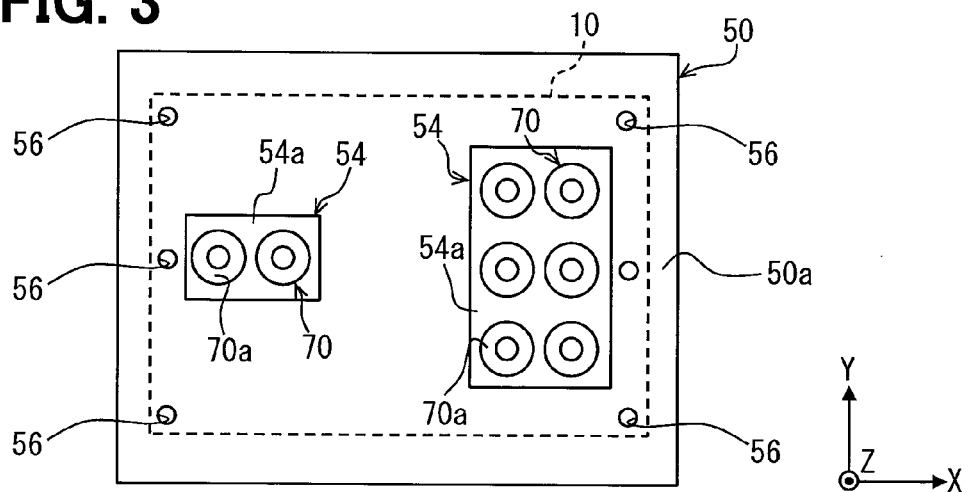
FIG. 3 is a plan view showing a housing of the electronic device.

The circuit board 10 is screwed onto the housing 50. The housing 50 has screw holes 56 at positions substantially same as the positions of the through holes 16 in the projection view viewed in the Z direction. As shown in FIG. 3, the housing 50 has multiple screw holes 56 corresponding to the multiple through holes 16. The screw holes 56 are recessed from the front surface 50a by a predetermined dept. The screw holes 56 are formed at the portions different from the positions of the recessed portions 54 in the projection view viewed in the Z direction.

Screws 58 are screwed into the screw holes 56, respectively, to extend through the through holes 16, respectively. In this way, the circuit board 10 is affixed to the housing 50. The housing 50 and the case 30 are affixed to each other at an unillustrated position. The case 30 and the housing 50 are in rectangular shapes in a plan view.

The front surface 50a has an area greater than an area of the rear surface 10b. The circuit board 10 is mounted to the housing 50 such that the entirety of the circuit board 10 overlaps with a part of the housing 50 in the projection view viewed in the Z direction. The housing 50 includes two recessed portions 54. Each of the recessed portions 54 is in a rectangular shape when viewed in a plan view.

The support members 70 support the circuit board 10 when the press-fit terminals 40 are press-fitted into the through holes 12. The support members 70 are interposed between the rear surface 10b and the inner surface 54a in the Z direction. That is, the support members 70 are sandwiched between the circuit board 10 and the housing 50 and are affixed altogether.

At least ends of the support members 70 on the side of the circuit board 10 are formed of an electrically insulative material. In the present embodiment, the support members 70 are entirely formed of an electrically insulative material. More specifically, the support member 70 is formed of a resin material.

The support members 70 are in contact with both the rear surface 10b and the inner surface 54a. Each of the support members 70 has a first surface 70a and a second surface 70b. The first surface 70a is in contact with the rear surface 10b. The second surface 70b is in contact with the inner surface 54a. The second surface 70b is located on the opposite side of the first surface 70a in the Z direction. The first surface 70a and the second surface 70b are flat planes in parallel with the X-Y plane.

In the present embodiment, the electronic device 100 includes multiple support members 70 corresponding to the press-fit terminals 40. Each of the support members 70 corresponds to one of the press-fit terminals 40 and corresponds to one of the through holes 12. Each of the support members 70 is located around corresponding one of the through holes 12 in the projection view viewed in the Z direction.

Figure 4:
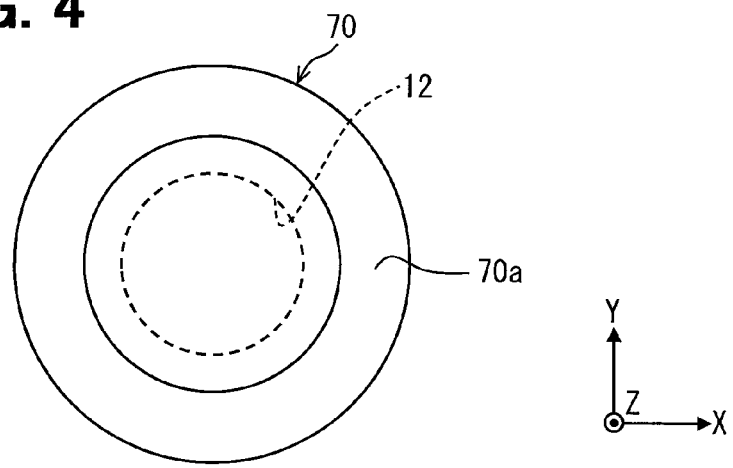
FIG. 4 is a plan view showing a detailed configuration of the support members of the electronic device.

As shown in FIG. 4, the first surface 70a is in a ring shape surrounding the through hole 12. In the present embodiment, the first surface 70a is in a circular ring shape. In FIG. 4, a dashed line represents a wall surface of the through hole 12. A center of the first surface 70a substantially coincides with a center of the through hole 12 in the projection view viewed in the Z direction. The support member 70 is in a bottomed tubular shape. In the present embodiment, the support member 70 is in a bottomed cylindrical shape.

The support member 70 supports the rear surface portion 14b of the circuit board 10. More specifically, the first surface 70a is entirely in contact with a part of the rear surface portion 14b. That is, the support member 70 is not in contact with a portion of the rear surface 10b other than the rear surface portion 14b.

In the Z direction, the length of the support member 70 is equivalent to the length from the second surface 70b to the first surface 70a. As follows, the length of the support member 70 in the Z direction is represented by a length L1. In addition, in the Z direction, a length from the inner surface 54a to a portion of the rear surface 10b of the circuit board 10, which is affixed to the housing 50, is represented by a length L2. The length L2 is substantially the same as the depth by which the recessed portion 54 is dented. In the present embodiment, the length L1 is substantially the same as the length L2.

Subsequently, an assembling method of the electronic device 100 will be described with reference to FIGS. 5 to 7.

Figure 5:
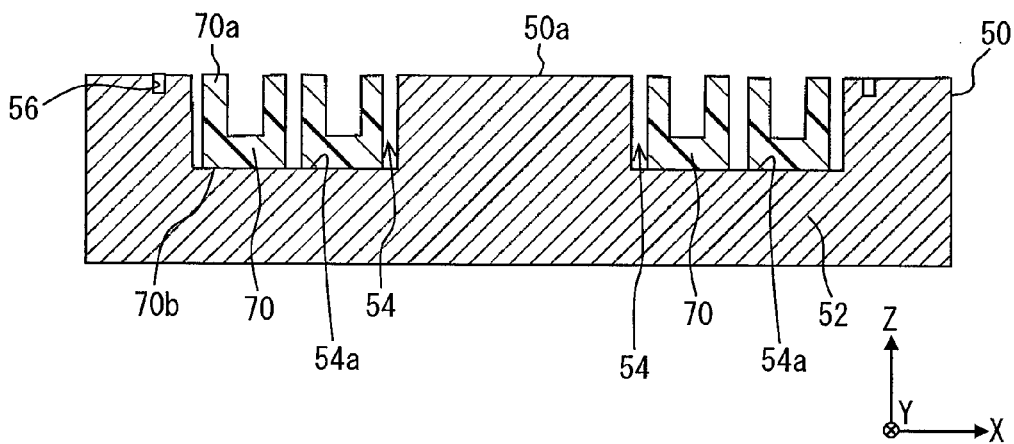
FIG. 5 is a sectional view for explanation of a locating process.

To begin with, as shown in FIG. 5, a locating process is implemented to locate the housing 50 to the support member 70. Specifically, the support members 70 are located in the recessed portion 54, such that the second surfaces 70b make contact with the inner surface 54a.

Figure 6:
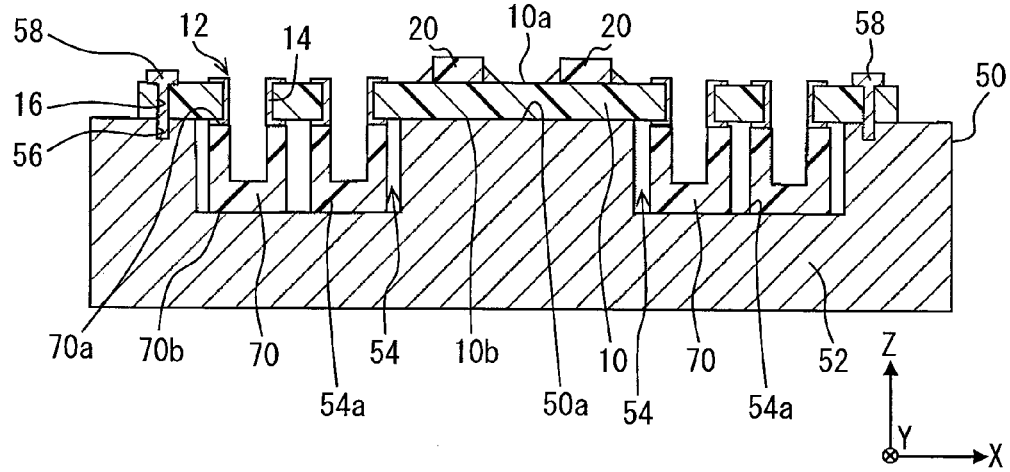
FIG. 6 is a sectional view for explanation of an affixing process.

Subsequent to the locating process, as shown in FIG. 6, an affixing process is implemented to affix the circuit board 10 onto the housing 50. In the affixing process, the circuit board 10 is first located in the housing 50, such that the rear surface 10b makes contact with the front surface 50a. More specifically, the circuit board 10 is located on the housing 50, such that the positions of the screw holes 56 substantially coincide with the positions of the through holes 16 in the projection view viewed in the Z direction. After the circuit board 10 is located in the housing 50, the circuit board 10 is screwed to the housing 50.

Figure 7:
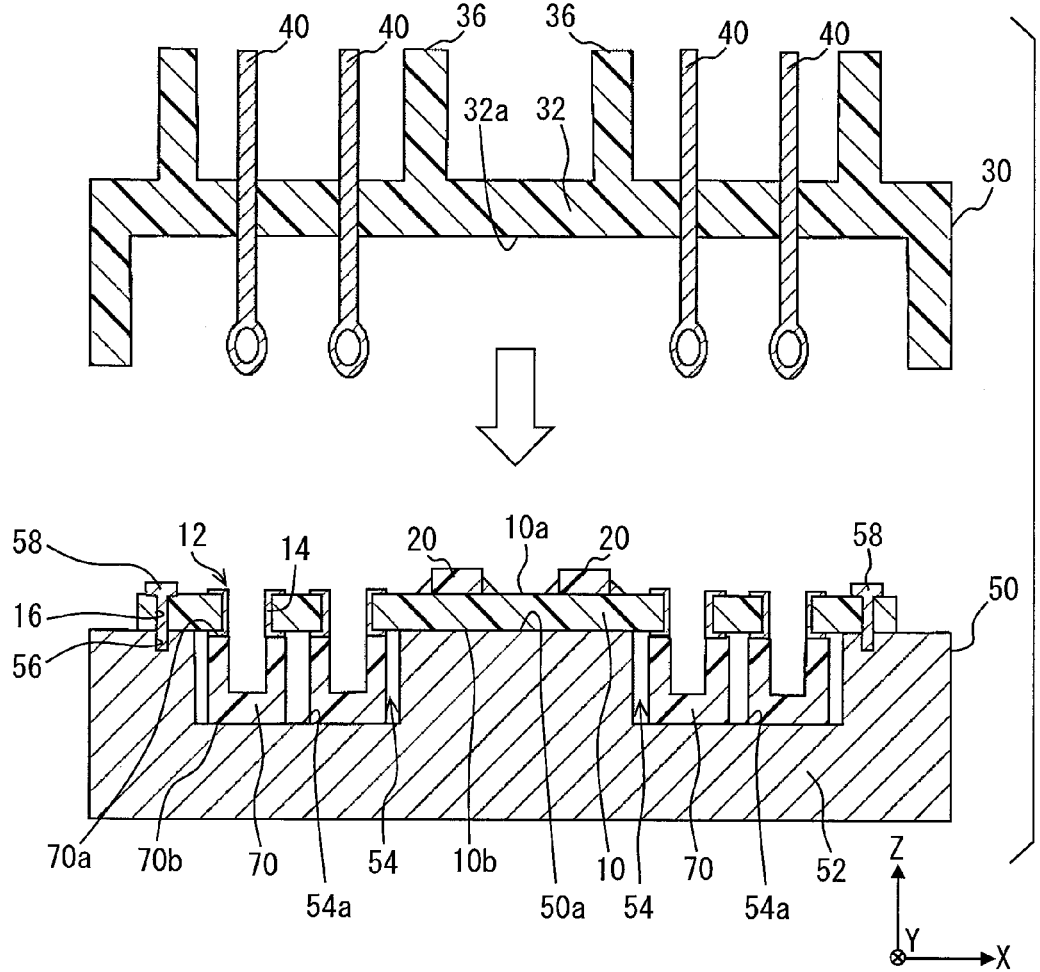
FIG. 7 is a sectional view for explanation of a press-fitting process.

Subsequent to the affixing process, as shown in FIG. 7, a press-fitting process is implemented to press-fit the press-fit terminals 40 into the through holes 12, respectively. In the present embodiment, the case 30 and the press-fit terminals 40 are moved with respect to the circuit board 10 in the Z direction, thereby to press-fit the press-fit terminals 40 into the through holes 12, respectively. A hollow arrow in FIG. 7 represents the direction in which the case 30 and the press-fit terminals 40 are moved.

After the press-fit terminal 40 is press-fitted, the case 30 and the housing 50 are affixed to each other. By implementing the above-described processes, the electronic device 100 shown in FIGS. 1 to 4 can be assembled. After the electronic device 100 is assembled, an examining process is implemented to examine whether the press-fit terminals 40 are press-fitted normally.

Subsequently, the examining process will be described with reference to FIGS. 8 to 9.

Figure 8:
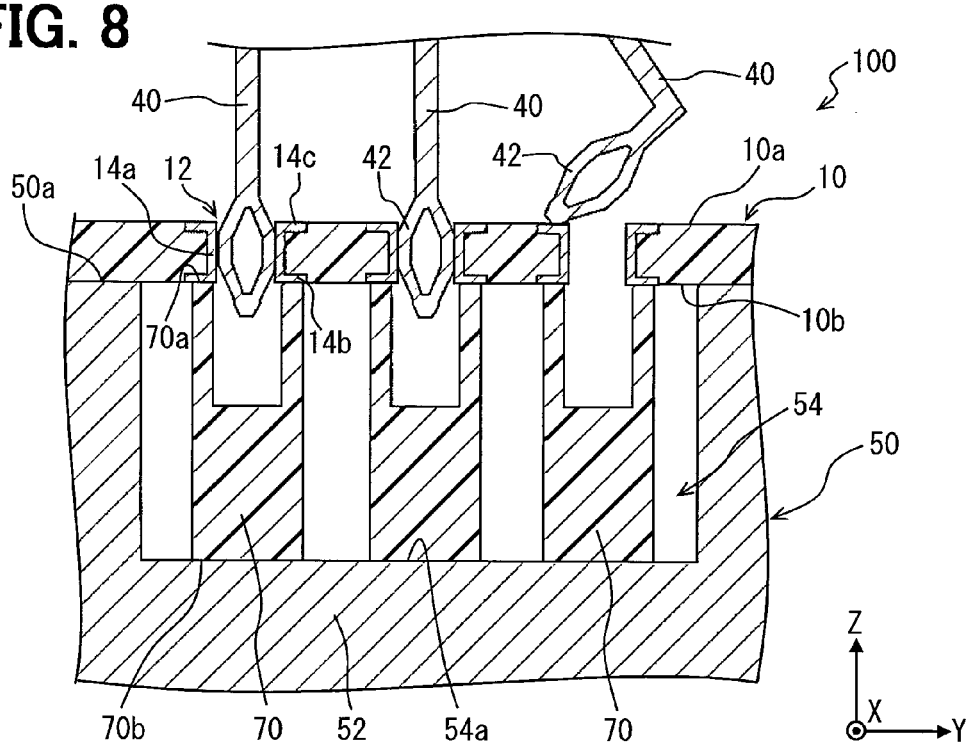
FIG. 8 is a sectional view for explanation of an examining process.
Figure 9:
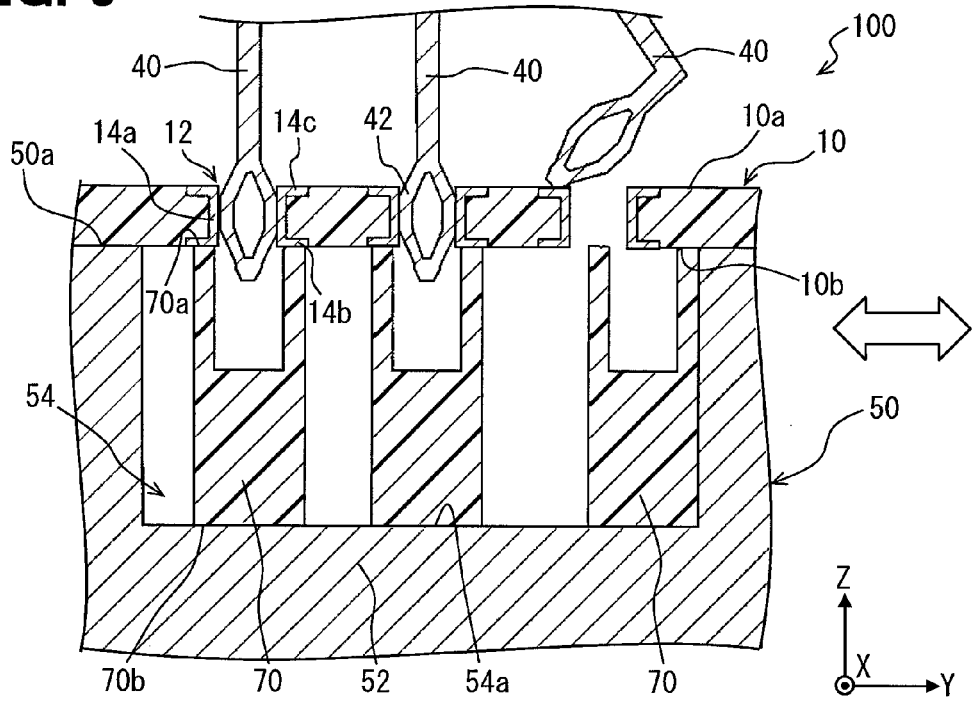
FIG. 9 is a sectional view for explanation of the examining process.

As shown in FIG. 8, in the press-fitting process, specific one(s) of the press-fit terminals 40 may not be press-fitted into corresponding one(s) of the through hole 12. FIG. 8 shows an example causing a misalignment to be unable to press-fit the press-fit terminal 40 into the through hole 12. In the following description, the press-fit terminal, which is not press-fitted into the through hole 12, is represented by a malfunctioning terminal. In the example shown in FIG. 8, the resilient portion 42 of the malfunctioning terminal is not press-fitted into the through hole 12 and is in contact with the front surface 10a. Moreover, in the example, the malfunctioning terminal causes compression buckling.

When the press-fit terminal 40 is press-fitted into the through hole 12, the press-fit terminal 40 applies a stress onto the circuit board 10 around a circumference of the through hole 12. In the present state, the circuit board 10 applies a stress to the support member 70 in the direction from the rear surface 10b toward the inner surface 54a along the Z direction. In this way, the support member 70 is interposed and held between the rear surface 10b and the inner surface 54a. It is noted that, the press-fitting does not cause a stress in the circuit board 10 around the periphery of the through hole 12, which corresponds to the malfunctioning terminal. Therefore, the support member 70, which corresponds to the malfunctioning terminal, is not held between the rear surface 10b and the inner surface 54a.

The present embodiment employs the configuration in which the case 30 functions as the connector housing. Therefore, in the configuration, visual examination whether the press-fit terminals 40 are normally press-fitted may be hardly implemented subsequent to the press-fitting process. Therefore, according to the present embodiment, the examining process is implemented by oscillating the electronic device 100, subsequent to the press-fitting process.

In the examining process, the electronic device 100 is oscillated in a direction perpendicular to the Z direction. A hollow arrow in FIG. 9 represents the direction in which the electronic device 100 is oscillated. The support member 70 held by the rear surface 10b and the inner surface 54a does not move relative to the circuit board 10 and the housing 50, even in a case where the electronic device 100 is oscillated.

To the contrary, the support member 70, which corresponds to the malfunctioning terminal, moves relative to the circuit board 10 and the housing 50 by the oscillation of the electronic device 100. Consequently, the support member 70 collides against the housing 50. Thus, the support member 70 and the housing 50 colliding against each other cause an abnormal noise. In the examining process, an abnormal noise occurs by oscillation of the electronic device 100 in a case where at least one malfunctioning terminal exists in the electronic device 100. Therefore, examination whether the malfunctioning terminal exists can be implemented if the abnormal noise occurs.

Subsequently, effects of the electronic device 100 will be described.

In the present embodiment, the electronic device 100 includes the support member 70. Therefore, the support member 70 enables to protect the circuit board 10 from deformation when the press-fit terminals 40 are press-fitted into the through holes 12, respectively.

In addition, in the present embodiment, the support members 70 are interposed between the rear surface 10b and the inner surface 54a and held by the rear surface 10b and the inner surface 54a. Therefore, the present configuration enables to omit a process to apply an external force to affix the support members 70 onto the circuit board 10 when the press-fit terminals 40 are press-fitted into the through holes 12. In addition, the present configuration enables to omit a process to remove the support members 70 from the circuit board 10. Therefore, the present configuration enables to restrict an assembly process for the electronic device 100 from increasing.

Furthermore, in the present embodiment, the present configuration does not require to affix the support members 70 to the circuit board 10 and/or the housing 50 by adhesion, screwing, and/or the like. Therefore, the present configuration enables to simplify a process to fix the support member 70 and to restrict an assembly process for the electronic device 100 from increasing.

In general, the support member 70 may be formed of a metallic material. To the contrary, in the present embodiment, the support member 70 is formed of an electrically insulative material at an end on the side of the circuit board 10. The present configuration restricts the support members 70 from causing ablation on a portion of the circuit board 10 on the side of the rear surface 10b, compared with a configuration in which the support members 70 are entirely formed of a metallic material.

It is assumable to employ a configuration in which the support members 70 are entirely formed of a metallic material. Further, in this configuration, the support members 70 may be held by a portion of the rear surface 10b in which a wiring is formed. In this configuration, in a case where the resist material is ablated, the support member 70 may cause shortcircuit with the wiring. Therefore, a configuration is assumable to hold the support members 70 at a portion of the rear surface 10b in which a wiring is not formed. However, in this configuration, the rear surface 10b may have a limited small area in which a wiring is formed.

To the contrary, according to the present embodiment, the support members 70 are at least partially formed of an electrically insulative material. Therefore, the support members 70 do not cause shortcircuit with a wiring. Thus, the present configuration enables a portion of the rear surface 10b, in which a wiring is formed, to hold the support members 70. Therefore, the present configuration enables to restrict the area of the rear surface 10b, in which a wiring is formed, from decreasing.

It is noted that, in a configuration, in which the support members 70 are formed of a metallic material, and in which the support members 70 are held by the rear surface portion 14b, the support members 70 may cause shortcircuit with the rear surface portion 14b. Therefore, in this configuration, the support member 70 needs to be held at a portion of the rear surface 10b distant from the rear surface portion 14b.

It is noted that, when the press-fit terminals 40 are press-fitted into the through holes 12, the circuit board 10 is easily deformed at a portion close to the through holes 12 in the projection view viewed in the Z direction. It is further noted that, in a configuration, in which the support members 70 are held by a portion of the rear surface 10b distant from the rear surface portion 14b, a portion of the support member 70, which supports the circuit board 10, may be distant from the through hole 12 in the projection view viewed in the Z direction.

To the contrary, according to the present embodiment, the support members 70 are at least partially formed of a resin material. In addition, the support members 70 support the rear surface portion 14b. Therefore, the support member 70 is enabled to support a portion of the circuit board 10 close to the through hole 12, without causing shortcircuit with the rear surface portion 14b. That is, the support members 70 are effectively enabled to restrict the circuit board 10 from deforming without causing shortcircuit with the rear surface portion 14b.

It is assumable to employ a configuration in which a singular support member 70 is formed correspondingly to the multiple press-fit terminals 40. In this present configuration, in the press-fitting process, at least one of the press-fit terminals 40, which corresponds to the support member 70, is press-fitted into the through hole 12. Consequently, a stress works in the support member 70. In this way, the support member 70 is held and interposed between the circuit board 10 and the housing 50.

Therefore, even in a configuration in which the press-fit terminal 40, which corresponds to the support member 70, is not press-fitted, the support member 70 may be held by the circuit board 10 and the housing 50. In this configuration, even if the electronic device 100 includes a malfunctioning terminal, the electronic device 100 may not cause an abnormal noise by application of oscillation. As a result, in this configuration, the examining process may be hardly implemented.

To the contrary, according to the present embodiment, each support member 70 corresponds to one of the through holes 12 and corresponds to one of the press-fit terminals 40. Furthermore, each support member 70 is located around the corresponding one through hole 12 in the projection view viewed in the Z direction. In the present structure, in a case where any one of the press-fit terminals 40 becomes the malfunctioning terminal, the support member 70, which corresponds to the malfunctioning terminal, moves to cause an abnormal noise by application of oscillation to the electronic device 100. Therefore, the present configuration facilitates to implement the examining process.

When the press-fit terminal 40 is press-fitted into the through hole 12, a portion of the circuit board 10, which is around a circumferential periphery of the through hole 12 in the projection view viewed in the Z direction, tends to deform. According to the present embodiment, the first surface 70a is in a ring shape surrounding the through hole 12. The present configuration enables the support member 70 to support a portion of the circuit board 10, which tends to deform. Therefore, the present configuration effectively restricts deformation of the circuit board 10.

When the press-fit terminal 40 is press-fitted into the through hole 12, at least one of the first land 14 and the press-fit terminal 40 may be ablated to cause metallic debris. In the present embodiment, the support member 70 is in a bottomed tubular shape. The present configuration tends to place metallic debris in a space surrounded by the support member 70. Therefore, the present configuration restricts metallic debris from adhering onto the circuit board 10 even when the electronic device 100 is applied with oscillation. Therefore, the present configuration effectively enables to restrict wirings and/or the like of the circuit board 10 from causing short circuit due to adherence of metallic debris onto the circuit board 10.

Figure 10:
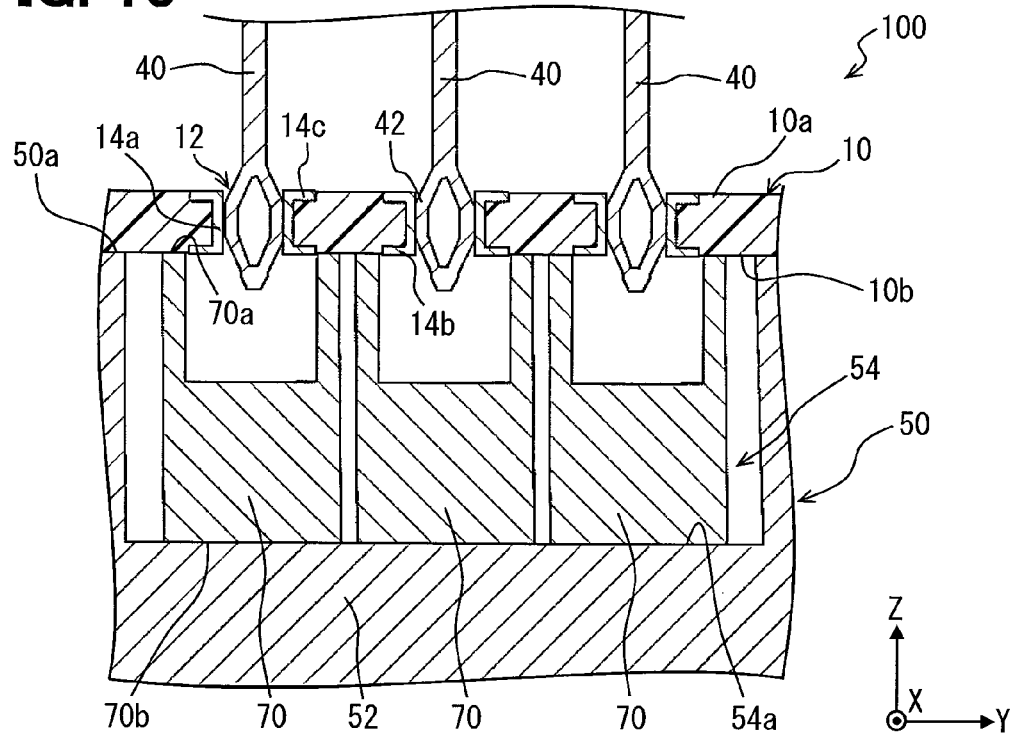
FIG. 10 is an enlarged sectional view showing a detailed configuration of support members of an electronic device according to a first modification.

In the present embodiment, the support member 70, which is entirely formed of a resin material, is exemplified. It is noted that, the support member 70 is not limited to the example. As exemplified in a first modification shown in FIG. 10, the support member 70 may be entirely formed of a metallic material. In this example, the support members 70 support the rear surface 10b at positions different from positions of the rear surface portions 14b such that the support members 70 does not cause shortcircuit with the first lands 14.

In addition, an example, in which an end of the support member 70 on the side of the circuit board 10 is formed of an electrically insulative material, may be employed. For example, the end of the support member 70 on the side of the circuit board 10 may be coated with a resin material.

Figure 11:
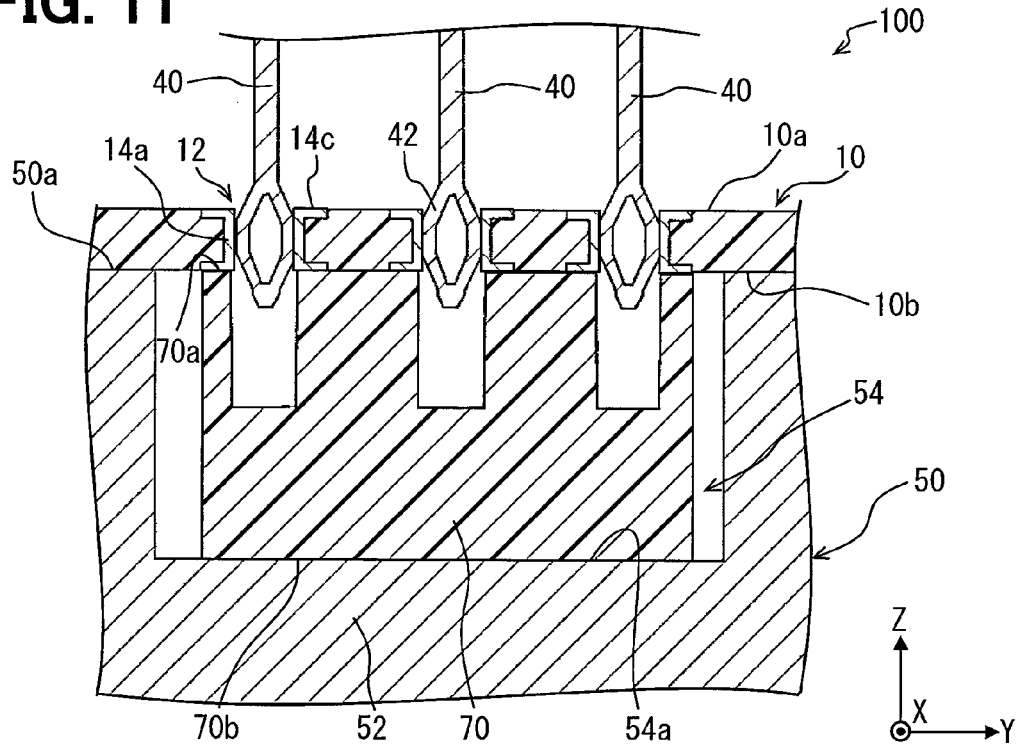
FIG. 11 is an enlarged sectional view showing a detailed configuration of support members of an electronic device according to a second modification.

In the present embodiment, the electronic device 100, which includes multiple support members 70, is exemplified. It is noted that, the electronic device 100 is not limited to the example. As exemplified in a second modification shown in FIG. 11, an example, in which the electronic device 100 includes a singular support member 70, may be employed.

(Second Embodiment)

Figure 12:
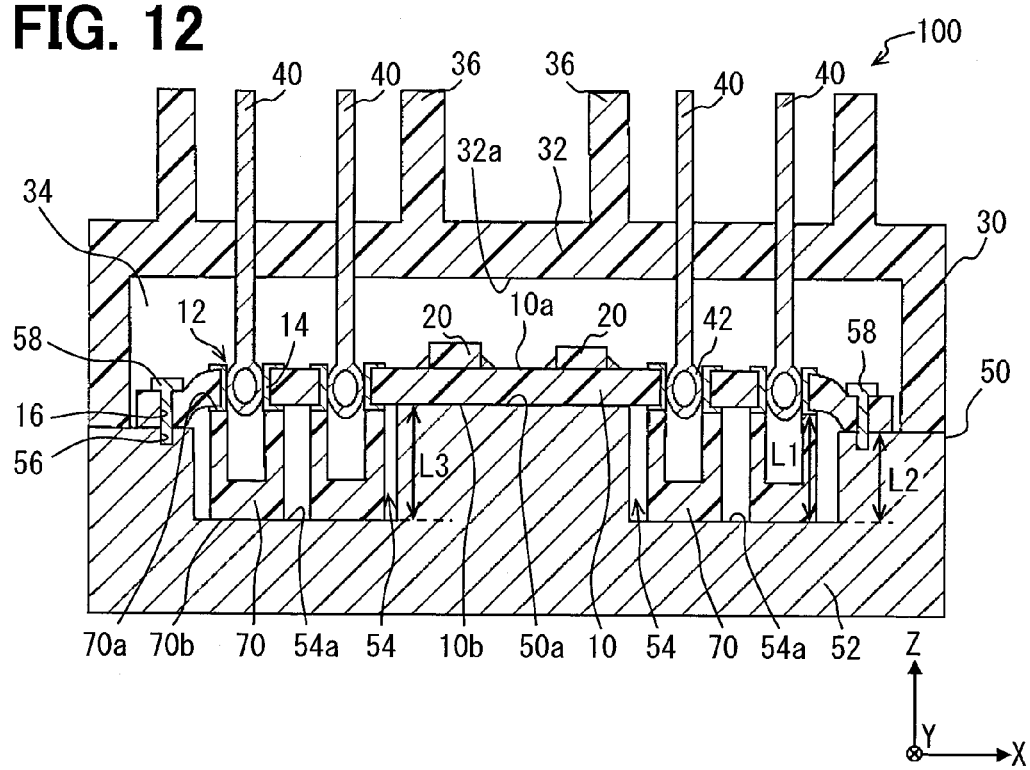
FIG. 12 is a sectional view showing an electronic device according to a second embodiment.

As shown in FIG. 12, the length L1 is set longer than the length L2. By application of stress caused by the support members 70, a portion of the circuit board 10, which is supported by the support members 70, is deformed in a direction to be away from the inner surfaces 54a relative to a part of the circuit board 10, which is affixed to the housing 50. That is, the portion of the circuit board 10 supported by the support members 70 is deformed to be projected toward the bottom portion 32 in the Z direction.

A length from the inner surface 54a to a portion of the rear surface 10b, which overlaps with the electronic components 20 in the projection view viewed in the Z direction, is substantially the same as the length L1. In the following description, the length from the inner surface 54a to the portion of the rear surface 10b, which overlaps with the electronic components 20 in the projection view viewed in the Z direction, is represented by a length L3. A portion of the rear surface 10b, which overlaps with the electronic components 20 in the projection view viewed along the Z direction, is a flat plane, which is in parallel with the X-Y plane. Therefore, a portion of the front surface 10a, on which the electronic components 20 are mounted, is a flat plane, which is in parallel with the X-Y plane.

As follows, an assembling method of the electronic device 100 will be described. First, the circuit board 10 is prepared. The circuit board 10 has the front surface 10a and the entire rear surface 10b, both of which are flat planes. Subsequently, the locating process is implemented. Thereafter, the circuit board 10 is affixed to the housing 50 in an affixing process. In the present process, the circuit board 10 is, while being deformed, affixed to the housing 50. Subsequent to the affixing process, the circuit board 10 and the housing 50 apply stress to each other in the Z direction. Subsequent to the affixing process, the press-fitting process is implemented.

As an ambient temperature around the electronic device 100 decreases, the support member 70, the housing 50, and the circuit board 10 contract. The present embodiment employs a configuration, in which the first surface 70a and the rear surface 10b do not form a gap therebetween, even when the ambient temperature around the electronic device 100 decreases to an assumable minimum temperature. Specifically, in the present configuration, a length, which is calculated by subtracting the length L2 from the length L1 when the ambient temperature is at the minimum temperature, is greater than a length by which the circuit board 10 contracts in the Z direction. So as to satisfy this condition, materials of the support member 70, the housing 50, and the circuit board 10 are selected, and the length L1 and the length L2 are determined.

In the present embodiment, the length L1 is set to be greater than the length L2. In addition, the circuit board 10 is deforming by the stress caused by the support member 70. Therefore, the present configuration enables to cause the rear surface 10b and the first surface 70a to be steadily in contact with each other. In other words, the present configuration effectively enables to restrict the rear surface 10b and the first surface 70a from forming a gap therebetween. Therefore, the present configuration effectively enables to restrict the circuit board 10 from deforming when the press-fit terminal 40 is press-fitted into the through hole 12. In addition, the present configuration facilitates to hold the support member 70 by utilizing the stress caused by the circuit board 10. The present configuration enables to restrain misalignment of the support member 70 relative to the circuit board 10 and the housing 50.

(Third Embodiment)

Figure 13:
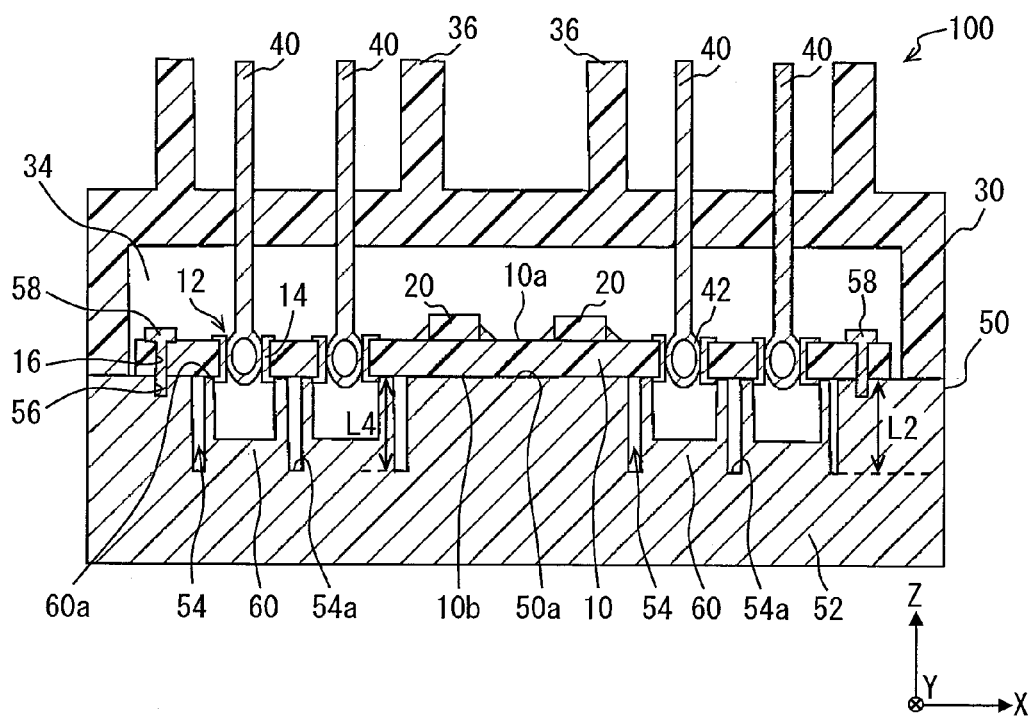
FIG. 13 is a sectional view showing an electronic device according to a third embodiment.
Figure 14:
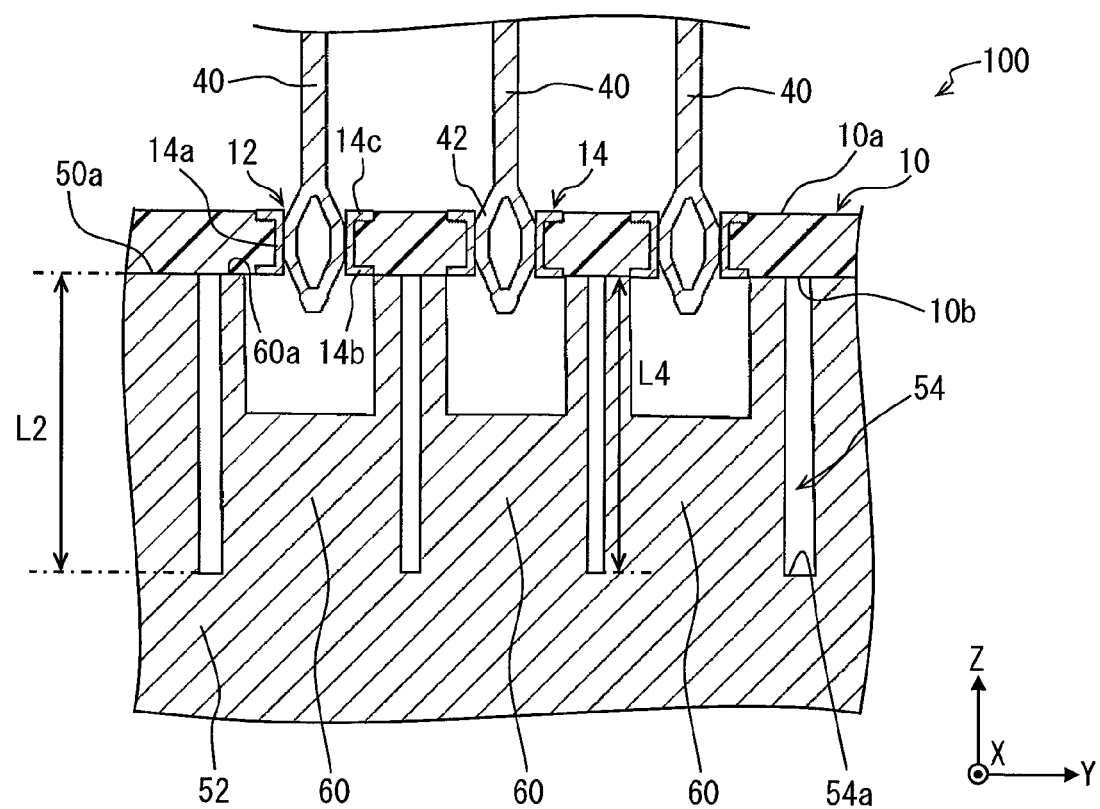
FIG. 14 is an enlarged sectional view showing a detailed configuration of projections.

As shown in FIGS. 13 and 14, the housing 50 has projections 60 each projected from the inner surface 54a toward the rear surface 10b. The projections 60 are configured to support the circuit board 10 when the press-fit terminals 40 are press-fitted into the through holes 12. Projection tip end surfaces 60a of the projections 60 are in contact with the rear surface 10b. The projection tip end surfaces 60a are flat planes in parallel with the X-Y plane. In present embodiment, the electronic device 100 does not include the support member 70.

In the present embodiment, the housing 50 includes the multiple projections 60, which correspond to the press-fit terminals 40, respectively. The projections 60 are located around the through holes 12, respectively, in the projection view viewed in the Z direction. The projection tip end surface 60a of each projection 60 is in a ring shape surrounding the through hole 12. Each projection 60 is in a bottomed tubular shape.

Similarly to the first embodiment, the housing 50 is formed of a metallic material. The projection 60 is entirely formed of a metallic material. The projections 60 support a portion of the circuit board 10 distant from the rear surface portions 14b. The present configuration enables the housing 50 from causing shortcircuit with the first land 14.

According to the present embodiment, the projections 60 support the portion of the rear surface 10b in which wirings are not formed. The present configuration enables to restrict the housing 50 from causing shortcircuit with the first land 14 even in a case where a resist material, which sheaths wirings, is removed.

A projection height of the projection 60 is equivalent to a length from the inner surface 54a to the projection tip end surface 60a in the Z direction. In the following description, the projection height of the projection 60 is represented by a projection height L4. The projection height L4 is set to be substantially the same as the length L2. Similarly to the first embodiment, the front surface 10a and the rear surface 10b are flat planes in parallel with the X-Y plane.

The present embodiment enables to restrict the projection 60 from deforming the circuit board 10 when the press-fit terminal 40 is press-fitted into the through hole 12. In the present embodiment, the projections 60 are a part of the housing 50. Therefore, the present configuration need not application of an external force to affix the support member 70 onto the circuit board 10, when the press-fit terminal 40 is press-fitted into the through hole 12. Thus, the present configuration enables to omit a process to remove the support members 70 from the circuit board 10. In addition, the present configuration enables to omit a process to affix the support member 70 onto the circuit board 10 or the housing 50. Therefore, the present configuration enables to restrict increase in manpower for assembling the electronic device 100.

Furthermore, the present embodiment enables to omit the locating process. Therefore, the present configuration effectively enables to restrict increase in manpower for assembling the electronic device 100.

In the present embodiment, the projection 60, which is entirely formed of a metallic material, is exemplified. It is noted that, the projection 60 is not limited to the example. An example, in which the projection tip end of the projection 60 is formed of an electrically insulative material, may be employed. For example, the projection tip end may be coated with a resin material. In this example, the projection 60 is enabled to support the rear surface portion 14b. An example, in which the projection 60 is entirely formed of a resin material, may be employed.

In the present embodiment, the housing 50, which includes multiple projections 60, is exemplified. It is noted that, the housing 50 is not limited to the example. A configuration, in which the housing 50 includes at least one projection 60, may be employed.

In the present embodiment, the configuration, in which the projection height L4 is the same as the length L2, is exemplified. It is noted that, the housing 50 is not limited to the example. An example, in which the projection height L4 is set to be greater than the length L2, may be employed. In this example, by application of stress caused by the projections 60, a portion of the circuit board 10, which is supported by the projections 60, is deformed in a direction to be away from the inner surfaces 32a relative to a part of the circuit board 10, which is affixed to the housing 50. The present configuration enables to produce an effect similar to that of the electronic device 100 in the second embodiment.

This example employs a configuration, in which the projection tip end surface 60a and the rear surface 10b do not form a gap therebetween, even when the ambient temperature around the electronic device 100 decreases to an assumable minimum temperature. Specifically, in the present configuration, a length, which is calculated by subtracting the length L2 from the projection length L4 when the ambient temperature is at the minimum temperature, is greater than a length by which the circuit board 10 contracts in the Z direction.

It is noted that, the present disclosure is not restricted to the above-described embodiments. The present disclosure may be arbitrarily modified into various forms.

The above embodiments exemplify the planar shape of the housing 50 in a rectangular shape. It is noted that, the shape of the housing 50 is not limited to the above embodiments. An example, in which the planar shape of the housing 50 is in a circular shape, may be employed.

The above embodiments exemplify the circuit board 10 affixed to the housing 50 by screwing. The affixation of the circuit board 10 is not limit to the above-described example. An example, in which the rear surface 10b is bonded onto the front surface 50a by using an adhesive material thereby to affix the circuit board 10 onto the housing 50, may be employed.

The above embodiments exemplify the electronic device 100 equipped with the eight press-fit terminals 40 and the eight through holes 12. The configuration of the electronic device 100 is not limited to the above-described example. A configuration of the electronic device 100 equipped with at least one press-fit terminal 40 and at least one through hole 12 may be employed.

The above embodiments exemplifies the housing 50 formed of a metallic material. It is noted that, the housing 50 is not limited to the above embodiments. An example, in which the housing 50 is formed of a resin material, may be employed.

The above embodiments exemplify the support member 70 and the projection 60 in bottomed tubular shapes. The support member 70 and the projection 60 are not limited to the above embodiments. An example, in which the support member 70 and/or the projection 60 is in a pillar-shape, may be employed.

The above embodiments exemplify the electronic components 20 mounted only on the front surface 10a. The configuration of the electronic components 20 are not limited to the above embodiments. An example, in which the electronic components 20 are mounted on the rear surface 10b, may be employed. A configuration of the electronic components 20, which are inserted and mounted, may be employed.

According to the electronic device of the present disclosure, the circuit board 10 has the through hole 12 and the land 14. The through hole 12 is formed throughout from the front surface 10a to the rear surface 10b. The rear surface 10b is on the opposite side of the front surface. The land 14 is formed on the wall surface of the through hole. The press-fit terminal 40 is press-fitted from the side of the front surface into the through hole and is connected to the land by application of a counter force caused by elastic deformation. The support member 70 is located on the side of the rear surface of the circuit board. The support member 70 supports the circuit board when the press-fit terminal is press-fitted into the through hole. The housing 50 is in the box shape. The housing 50 has the bottom portion 52 and one side having the opening. The opening is located on the opposite side of the bottom portion. The opening is covered with the circuit board such that that the circuit board covers the support member. The circuit board is affixed to the housing, such that the rear surface is located on the side of the housing. The support member is held and interposed between the rear surface and the inner surface 54a of the bottom portion in the thickness direction of the circuit board. The inner surface 54a of the bottom portion is located on the side of the circuit board.

This configuration may enable the support member to restrict the circuit board from deforming when the press-fit terminal is press-fitted into the through hole. In addition, according to this configuration, the support member is held by and interposed between the rear surface of the circuit board and the inner surface of the housing. Therefore, application of an external force to affix the circuit board onto the support member is not needed when the press-fit terminal is press-fitted into the through hole. In addition, this configuration enables to omit a process to remove the support member from the circuit board. Therefore, the present configuration enables to restrict an assembling process of the electronic device from increasing.

Furthermore, in the present configuration, the support member needed not be affixed to the circuit board and/or the housing by using an adhesive material, a screw, and/or the like. Therefore, the present configuration enables to simplify a process to affix the support member. In addition, the present configuration enables to restrict an assembling process of the electronic device from increasing.

According to the electronic device of the present disclosure, the circuit board 10 has the through hole 12 and the land 14. The through hole 12 is formed throughout from the front surface 10a to the rear surface 10b. The rear surface 10b is on the opposite side of the front surface. The land 14 is formed on the wall surface of the through hole. The press-fit terminal 40 is press-fitted from the side of the front surface into the through hole and is connected to the land by application of a counter force caused by elastic deformation. The housing 50 is in the box shape. The housing 50 has the bottom portion 52 and one side having the opening. The opening is located on the opposite side of the bottom portion. The opening is covered with the circuit board such that that the circuit board covers the support member. The circuit board is affixed to the housing, such that the rear surface is located on the side of the housing. The housing has the projection 60 projected from the inner surface 54a of the bottom portion toward the rear surface. The inner surface 54a is on the side of the circuit board. The projection 60 is in contact with the rear surface and supports the circuit board when the press-fit terminal is press-fitted into the through hole.

This configuration may enable the projection to restrict the circuit board from deforming when the press-fit terminal is press-fitted into the through hole. In the present configuration, the projection is a part of the housing. Therefore, application of an external force to affix the support member onto the circuit board need not be implemented when the press-fit terminal is press-fitted into the through hole. Thus, the present configuration enables to omit a process to remove the support member from the circuit board. In addition, the present configuration enables to omit a process to affix the support member onto the circuit board and/or the housing. Therefore, the present configuration enables to restrict an assembling process of the electronic device from increasing.

Furthermore, the configuration enables to omit a process to locate the support member on the housing. Therefore, the present configuration effectively enables to restrict an assembling process of the electronic device from increasing.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic device comprising:
    a circuit board having at least one through hole and a land, the at least one through hole extending from a front surface to a rear surface, which is on an opposite side of the front surface, the land formed on a wall surface of the at least one through hole;
    at least one press-fit terminal press-fitted from the front surface into the at least one through hole and connected to the land by application of a counter force caused by elastic deformation;
    at least one support member located on a side of the rear surface of the circuit board, the at least one support member supporting the circuit board when the at least one press-fit terminal is press-fitted into the at least one through hole; and
    a housing in a box shape and having a bottom portion and an opening, the opening located on an opposite side of the bottom portion, the opening being covered with the circuit board such that that the circuit board covers the at least one support member, wherein
    the circuit board is affixed to the housing such that the rear surface is located on a side of the housing,
    the at least one support member is held and interposed between the rear surface and an inner surface of the bottom portion in a thickness direction of the circuit board, the inner surface located on a side of the circuit board,
    the at least one support member is a separate component from the housing,
    the at least one support member is in a tubular shape, and
    the at least one press-fit terminal has an end inserted in the at least one support member.

2. The electronic device according to claim 1, wherein
    a length of the at least one support member is greater than a length, which is from the inner surface to a portion of the rear surface of the circuit board at which the circuit board is affixed to the housing, in the thickness direction, and
    a portion of the circuit board, at which the circuit board is supported by the at least one support member, is deformed in a direction to be away from the inner surface relative to a portion of the circuit board, at which the circuit board is affixed to the housing, by application of a stress caused by the at least one support member.

3. The electronic device according to claim 1, wherein
    at least an end of the at least one support member on a side of the circuit board is formed of an electrically insulative material.

4. The electronic device according to claim 3, wherein
    the land includes a wall surface portion and a rear surface portion,
    the wall surface portion is formed on a wall surface of the at least one through hole,
    the rear surface portion is connected with the wall surface portion and formed on a side of the rear surface, and
    the at least one support member supports the rear surface portion.

5. The electronic device according to claim 1, wherein
    the at least one press-fit terminal includes a plurality of press-fit terminals,
    the at least one support member includes a plurality of support members corresponding to the press-fit terminals,
    the at least one through hole includes a plurality of through holes into which the press-fit terminals are press-fitted, respectively, and
    the support members are located around the through holes, respectively, in a projection view viewed along the thickness direction.

6. The electronic device according to claim 1, wherein
    the at least one support member has a surface, which supports the circuit board, and
    the surface of the at least one support member is in an annular shape surrounding the at least one through hole in a projection view viewed in the thickness direction.

7. The electronic device according to claim 6, wherein
    the at least one support member is in a bottomed tubular shape.

8. The electronic device according to claim 1, wherein
    the housing is formed of a metallic material, and
    the at least one support member is formed of a resin material.

9. The electronic device according to claim 1, wherein
    the at least one support member has a first surface in contact with the rear surface of the circuit board, and
    the first surface is in an annular shape surrounding the at least one through hole.

10. The electronic device according to claim 9, wherein
    the at least one support member has a second surface on an opposite side of the first surface,
    the at least one support member is located in the bottom portion of the housing, and
    the second surface is in contact with the inner surface of the bottom portion.

11. The electronic device according to claim 1, wherein
    a length of the at least one support member is substantially the same as the a length, which is from the inner surface to a portion of the rear surface of the circuit board at which the circuit board is affixed to the housing, in the thickness direction.

12. An electronic device comprising:
    a circuit board having a through hole and a land, the through hole extending from a front surface to a rear surface, which is on an opposite side of the front surface, the land formed on a wall surface of the through hole;
    a press-fit terminal press-fitted from the front surface into the through hole and connected to the land by application of a counter force caused by elastic deformation; and a housing in a box shape and having a bottom portion and an opening, the opening located on an opposite side of the bottom portion, the opening being covered with the circuit board, wherein the circuit board is affixed to the housing such that the rear surface is located on a side of the housing, the housing has a projection projected from an inner surface of the bottom portion toward the rear surface, the inner surface being on a side of the circuit board, the projection is in contact with the rear surface and supports the circuit board when the press-fit terminal is press-fitted into the through hole, the projection is a separate component from the housing, the projection is in a tubular shape, and the press-fit terminal has an end inserted in the projection.

13. The electronic device according to claim 12, wherein a projection height of the projection is greater than a length, which is from the inner surface to a portion of the rear surface of the circuit board at which the circuit board is affixed to the housing, in a thickness direction of the circuit board, and a portion of the circuit board, at which the circuit board is supported by the projection, is deformed in a direction to be away from the inner surface relative to a portion of the circuit board, at which the circuit board is affixed to the housing, by application of a stress caused by the projection.

14. The electronic device according to claim 12, wherein at least a tip end of the projection is formed of an electrically insulative material.

15. The electronic device according to claim 14, wherein the land includes a wall surface portion and a rear surface portion, the wall surface portion is formed on a wall surface of the through hole, the rear surface portion is connected with the wall surface portion and formed on a side of the rear surface, and the projection supports the rear surface portion.

16. The electronic device according to claim 12, wherein the projection has a projection tip end surface, which is in an annular shape surrounding the through hole in a projection view viewed in a thickness direction of the circuit board.

17. The electronic device according to claim 16, wherein the projection is in a bottomed tubular shape.

* * * * *